(12) United States Patent
Xu et al.

(10) Patent No.: US 10,236,841 B2
(45) Date of Patent: Mar. 19, 2019

(54) DIFFERENTIAL AMPLIFIER

(71) Applicant: University of Electronic Science and Technology, Sichuan (CN)

(72) Inventors: Yuehang Xu, Sichuan (CN); Wei Xiao, Sichuan (CN); Xiansuo Liu, Sichuan (CN); Bowen Sun, Sichuan (CN)

(73) Assignee: University of Electronic Science and Technology, Sichuan (CN)

( * ) Notice: Subject to any disclaimer, the term of this patent is extended or adjusted under 35 U.S.C. 154(b) by 7 days.

(21) Appl. No.: 15/565,070

(22) PCT Filed: Aug. 10, 2016

(86) PCT No.: PCT/CN2016/094315
§ 371 (c)(1),
(2) Date: Oct. 6, 2017

(87) PCT Pub. No.: WO2018/027653
PCT Pub. Date: Feb. 15, 2018

(65) Prior Publication Data
US 2018/0309419 A1    Oct. 25, 2018

(51) Int. Cl.
*H01P 5/10* (2006.01)
*H03F 3/45* (2006.01)
*H01L 23/00* (2006.01)
*H03F 3/195* (2006.01)

(52) U.S. Cl.
CPC ......... *H03F 3/45076* (2013.01); *H01L 23/00* (2013.01); *H03F 3/195* (2013.01); *H03F 3/45381* (2013.01); *H03F 2200/06* (2013.01); *H03F 2200/09* (2013.01); *H03F 2200/451* (2013.01)

(58) Field of Classification Search
CPC .......... H01P 5/10; H03F 3/45; H03F 3/45076
USPC ............................................. 333/26; 330/295
See application file for complete search history.

(56) References Cited

U.S. PATENT DOCUMENTS

| | | | |
|---|---|---|---|
| 7,541,887 B2* | 6/2009 | Cheng | H01P 5/10 333/25 |
| 7,944,308 B2* | 5/2011 | Hsu | H03F 1/56 330/264 |
| 8,102,207 B2* | 1/2012 | Day | H03F 1/3211 330/149 |

(Continued)

*Primary Examiner* — Dean O Takaoka
(74) *Attorney, Agent, or Firm* — Wood Herron & Evans LLP

(57) ABSTRACT

A differential amplifier includes a pre-driver stage, an input balun, a matching network, a differential transistor pair, a bias network and an output balun. An output terminal of the pre-driver stage is connected to an input terminal of the input balun. An output terminal of the input balun is connected to the matching network. An output terminal of the matching network is connected to an input terminal of the differential transistor pair and to the bias network. An output terminal of the differential transistor pair is connected to the output balun. A single-turn laminated transformer is used as the input balun of the present invention, and the output balun is of a structure having an inner full frame and an outer half frame, thereby making the differential amplifier have small occupation area, low loss, high operating frequency and high power amplification efficiency.

7 Claims, 6 Drawing Sheets

(56) References Cited

U.S. PATENT DOCUMENTS

| | | | | |
|---|---|---|---|---|
| 8,314,658 B2* | 11/2012 | Kawakami | ............ | H03F 3/19 |
| | | | | 330/124 R |
| 8,536,948 B2* | 9/2013 | Kawai | ............ | H01P 5/10 |
| | | | | 330/124 R |
| 2006/0284698 A1* | 12/2006 | Vaisanen | ............ | H01P 3/088 |
| | | | | 333/26 |
| 2014/0368270 A1* | 12/2014 | Bouisse | ............ | H01P 5/10 |
| | | | | 330/255 |
| 2018/0076770 A1* | 3/2018 | Arfaei Malekzadeh | ............ | |
| | | | | H03F 3/265 |
| 2018/0191326 A1* | 7/2018 | Liu | ............ | H03H 7/42 |

* cited by examiner

DIFFERENTIAL AMPLIFIER

CROSS-REFERENCE TO RELATED APPLICATIONS

This application is a national phase of PCT/CN2016/094315, filed on Aug. 10, 2016. This prior application is incorporated herein by reference in its entirety.

TECHNICAL FIELD

The present invention relates to the technical field of amplifiers, and in particular, to a differential amplifier.

BACKGROUND

Differential amplifiers have been widely used in Silicon-based circuits such as Complementary Metal Oxide Semiconductor (CMOS) field effect transistors due to their advantages in suppressing common mode signals, reducing even harmonic components, suppressing odd-mode oscillation, etc. As a representative of the 3rd generation semiconductors, GaN (Gallium Nitride) devices have advantages of high voltage, high frequency, high power density, etc., and the differential amplifiers based on the GaN devices can thus break through the power output limitations involved in the Si-based circuits.

However, the existing differential amplifiers based on the GaN devices still have disadvantages of large occupation area, high loss, low operating frequency and low power amplification efficiency.

SUMMARY

An objective of the present invention is to provide a differential amplifier having the advantages of small occupation area, low loss, high operating frequency and high power amplification efficiency.

For this purpose, the present invention employs the following technical solutions.

A differential amplifier provided by the present invention comprises an input balun, a matching network, a differential transistor pair, a bias network and an output balun. An input terminal of the input balun is connected to an output terminal of a pre-driver stage. An output terminal of the input balun is connected to an input terminal of the matching network. An output terminal of the matching network is connected to an input terminal of the differential transistor pair, and is also connected to the bias network. An output terminal of the differential transistor pair is connected to the output balun. The input balun is a single-turn laminated transformer, and the output balun is a planar transformer having an inner full frame and an outer half frame.

In some embodiments, the input balun consists of an upper metal ring and a lower metal ring, which are overlapped. The upper metal ring and the lower metal ring each consist of horizontal single-layer metal sheets. A fracture is formed in each of the upper metal ring and the lower metal ring. A single-ended input terminal and an input balun ground terminal are extended from the fracture in the upper metal ring. The single-ended input terminal is connected to the output terminal of the pre-driver stage, and the input balun ground terminal is grounded. Two differential output terminals are extended from the fracture in the lower metal ring, and the two differential output terminals are connected correspondingly to two matching networks. The lower metal ring further comprises an input balun center tap which is grounded. The input balun ground terminal of the upper metal ring is connected to the input balun center tap of the lower metal ring through an input balun through hole.

In some embodiments, the output balun comprises an upper metal sheet and a lower metal sheet. The upper metal sheet is of a structure having an inner full frame and an outer half frame. A fracture is formed in the inner full frame of the upper metal sheet, and two differential input terminals are extended from the fracture in the inner full frame of the upper metal sheet. The two differential input terminals are connected to two output terminals of the differential transistor pair. Two capacitor terminals are extended from two sides of the inner full frame of the upper metal sheet, and two capacitor structures are formed between the two capacitor terminals and the lower metal sheet. Three terminals, that are an output terminal, a capacitor ground terminal and an output balun ground terminal, are extended outward from the outer half frame of the upper metal sheet. The output terminal is used for outputting a signal. A capacitor structure is formed between the capacitor ground terminal and the lower metal sheet, and the capacitor ground terminal is grounded through the upper metal sheet. The output balun ground terminal is grounded. The lower metal sheet is of a structure having an inner full frame. The lower metal sheet further comprises an output balun center tap which is connected to a DC bias terminal through the upper metal sheet. The inner full frame structure of the lower metal sheet and the inner full frame structure of the upper metal sheet are overlapped together. The upper metal sheet is connected to the lower metal sheet via through holes. The output balun comprises five output balun through holes, which are respectively located at two joints between the two differential input terminals and the inner full frame of the upper metal sheet, at a joint between the output balun center tap and the inner full frame of the lower metal sheet, at a joint between the output balun center tap and the DC bias terminal, and at a joint between the capacitor ground terminal and the lower metal sheet.

In some embodiments, a direct current is supplied to the output balun center tap, and shunted at a joint between the output balun center tap and the inner full frame of the lower metal sheet so that the direct current flows along the inner full frame of the lower metal sheet and respectively flows out from the two differential input terminals.

In some embodiments, the inner full frame of the output balun comprises an output balun coupling portion and an output balun non-coupling portion. The output balun non-coupling portion is a portion close to the two differential input terminals. The output balun non-coupling portion is of a narrow microstrip structure. The output balun coupling portion is a portion away from the two differential input terminals, and is of a wide microstrip structure.

In some embodiments, the overlapped portion of the upper metal ring and the lower metal ring in the input balun is structurally designed as a rectangle; and the input balun is vertically coupled through four sides of the rectangle.

In some embodiments, both the input balun and the output balun are made of GaN.

According to the specific embodiments of the present invention, the present invention discloses the following technical effects.

First, since the input balun is of a single-turn laminated structure, both the primary coil and the secondary coil are wound only about 1 turn to realize a single ended-to-differential conversion. Thus, the balun processing area in the two layers of metal is reduced.

Second, in the present application, the Silicon-based circuits having characteristics of semiconductors in the prior art are replaced with insulating GaN material. Accordingly, the output balun only needs to avoid metal loss resulted from the skin effect of the alternative current (AC) and the DC resistance, without considering the substrate loss in the CMOS reduced using a wide microstrip in the balun structure and the increase in distance between the metal and the substrate. As a result, types of loss are reduced. Thus, the technical solution of the present application significantly reduces the loss.

Third, in the present application, a narrow microstrip is used in the output balun to increase the inductive reactance of the output balun, reduce the capacitive reactance of the output balun, and increase the self-resonant frequency, so that the operating frequency is improved and the occupation area of the balun is reduced.

Fourth, in the present application, by incorporating the bias circuit into the output balun, capacitors and inductors are omitted from the bias circuit, and the occupation area of the differential amplifier is effectively reduced.

Fifth, in the present application, since the upper metal ring and the lower metal ring in the input balun are connected through an input balun through hole, the upper metal ring and the lower metal ring can share a same ground. Thus, the occupation area of the input balun is effectively reduced.

Sixth, in the present application, since the upper metal sheet and the lower metal sheet in the output balun are connected in parallel through output balun through holes, the occupation area of the output balun is effectively reduced, and the metal loss is reduced.

BRIEF DESCRIPTION OF THE DRAWINGS

Various additional features and advantages of the invention will become more apparent to those of ordinary skill in the art upon review of the following detailed description of one or more illustrative embodiments taken in conjunction with the accompanying drawings. The accompanying drawings, which are incorporated in and constitute a part of this specification, illustrate one or more embodiments of the invention and, together with the general description given above and the detailed description given below, explain the one or more embodiments of the invention.

DETAILED DESCRIPTION

The technical solutions in the embodiments of the present invention will be described clearly and completely below with reference to the drawings. Obviously, the described embodiments are merely some but not all the embodiments of the present invention. All other embodiments obtained by those skilled in the art based on the embodiments of the present invention without paying any creative effort shall be included within the protection scope of the present invention.

An objective of the present invention is to provide a differential amplifier.

To make the objective, feature and advantage of the present invention more clear, the present invention will be further described in detail in combination with the accompanying drawings and embodiments hereinafter.

Figure 1:
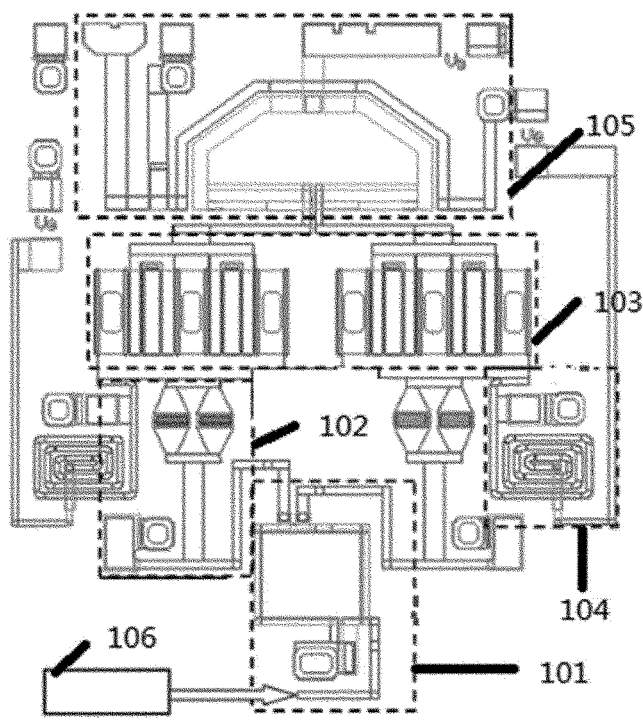
FIG. 1 is a view showing the layout of a differential amplifier, according to an embodiment of the differential amplifier of the present application.

FIG. 1 is a view showing the layout of a differential amplifier according to an embodiment of the differential amplifier of the present application.

Referring to FIG. 1, a differential amplifier comprises an input balun 101, a matching network 102, a differential transistor pair 103, a bias network 104 and an output balun 105. An input terminal of the input balun 101 is connected to an output terminal of a pre-driver stage 106 to receive an output signal from the pre-driver stage 106. An output terminal of the input balun 101 is connected to an input terminal of the matching network 102. An output terminal of the matching network 102 is connected to an input terminal of the differential transistor pair 103, and is also connected to the bias network 104. An output terminal of the differential transistor pair 103 is connected to the output balun 105. The input balun 101 is a single-turn laminated transformer, and the output balun 105 is a planar transformer having an inner full frame and an outer half frame.

Figure 2A:
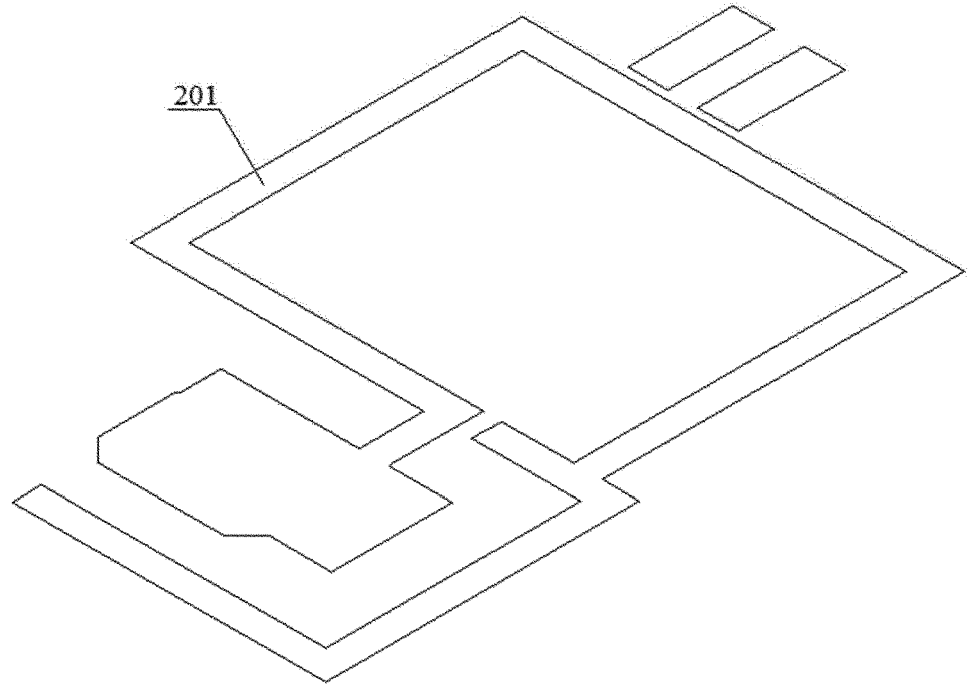
FIG. 2A is a structural diagram of an upper metal ring in an input balun, according to an embodiment of the differential amplifier of the present application.
Figure 2B:
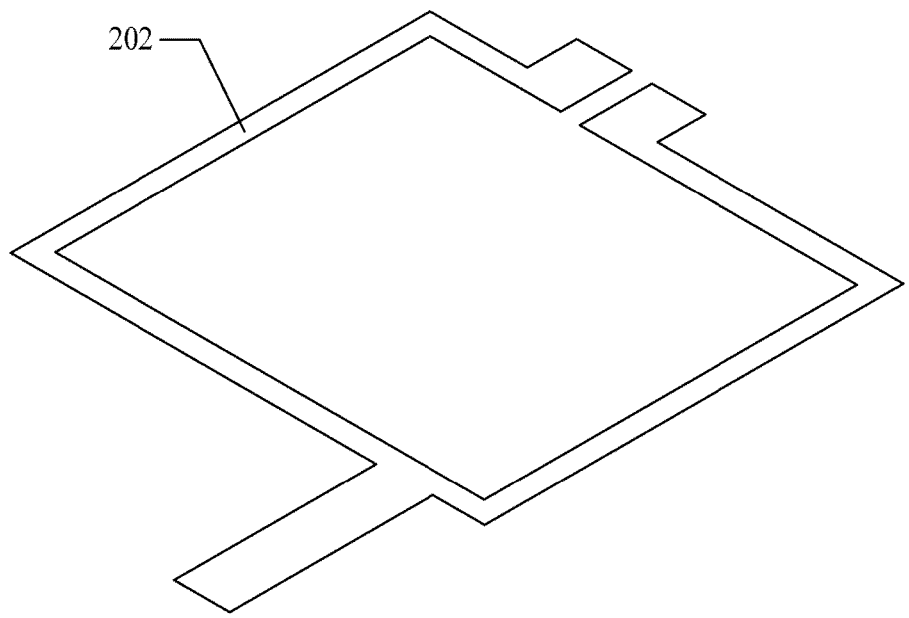
FIG. 2B is a structural diagram of a lower metal ring in an input balun, according to an embodiment of the differential amplifier of the present application.

FIG. 2A is a structural diagram of an upper metal ring 201 in an input balun, according to an embodiment of the differential amplifier of the present application; FIG. 2B is a structural diagram of a lower metal ring 202 in an input balun, according to an embodiment of the differential amplifier of the present application; and FIG. 2C is a structural diagram of the whole input balun 101, according to an embodiment of the differential amplifier of the present application.

Figure 2C:
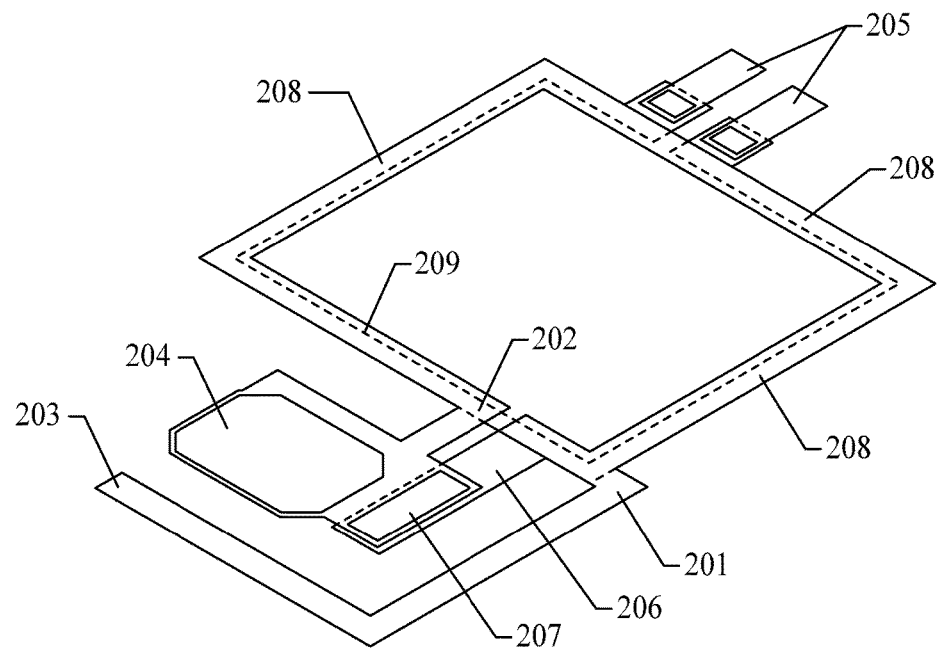
FIG. 2C is a structural diagram of the whole input balun, including the upper and lower metal rings of FIGS. 2A and 2B, and according to an embodiment of the differential amplifier of the present application.

Referring to FIG. 2A through FIG. 2C, the single-turn laminated transformer is a laminated transformer formed by two single-turn inductors. The two single-turn inductors comprise an upper metal ring 201 and a lower metal ring 202. The upper metal ring 201 and the lower metal ring 202 each consist of horizontal single-layer metal sheets, and a single-turn coil is wound onto each of the horizontal single-layer metal sheets. The input balun 101 is of a single-turn laminated structure, and both the primary coil and the secondary coil are wound only about 1 turn to realize a single ended-to-differential conversion. Thus, the balun processing area in the two layers of metal is reduced. Compared with the coupling between the spiral inductors used in the traditional laminated transformers, since energy from the magnetic field of a single-turn inductor is less concentrated, with high diffusivity, the input balun 101 performs the transfer of signals mainly depending upon the vertical coupling between the upper metal ring 201 and the lower metal ring 202. A fracture is formed in each of the upper metal ring 201 and the lower metal ring 202. A single-ended input terminal 203 and an input balun ground terminal 204 are extended from the fracture in the upper metal ring 201. The single-ended input terminal 203 is connected to the output terminal of the pre-driver stage 106, and the input balun ground terminal 204 is grounded. Two differential output terminals 205 are extended from the fracture in the lower metal ring 202, and formed as an anode and a cathode of the differential output terminals, respectively. The two differential output terminals 205 are connected correspondingly to two matching networks 102. The lower metal ring 202 further comprises an input balun center tap 206 which is grounded. The input balun ground terminal 204 of the upper metal ring 201 is connected to the input balun center tap 206 of the lower metal ring 202 through an input balun through hole 207 with an area of 0.3 mm*0.27 mm. In the present application, since the upper metal ring 201 and the lower metal ring 202 in the input balun 101 are connected through an input balun through hole 207, the upper metal ring 201 and the lower metal ring 202 can share a same ground. Thus, the occupation area of the input balun 101 is effectively reduced.

The input balun through hole 207 is formed in such a way that a hole is punched between the upper metal ring 201 and the lower metal ring 202, and then metal is injected into the hole so that the upper metal ring 201 and the lower metal ring 202 are communicated with each other. The input balun through hole 207 provides communication between the two metal rings, increases the number of conductive layers, allows the two layers of metal to conduct electricity simultaneously, decreases the resistance, and thus reduces the DC loss.

Optionally, an overlapped portion 208, 209 of the upper metal ring 201 and the lower metal ring 202 in the input balun 101 is structurally designed as a rectangle; and the input balun 101 is vertically coupled through four sides of the rectangle.

To reduce the loss of the matching network 102 resulted from an excessively great impedance conversion ratio, the input balun 101 first performs a conversion from 50 Ohms to a low impedance, and then performs matching between the gates of the differential transistor pair 103 by using the matching network 102. The impedance conversion of the input balun 101 is determined by a line width ratio of upper metal ring 201 and the lower metal ring 202. The technical solution of the present application effectively improves the impedance conversion of the input balun 101.

Figure 3A:
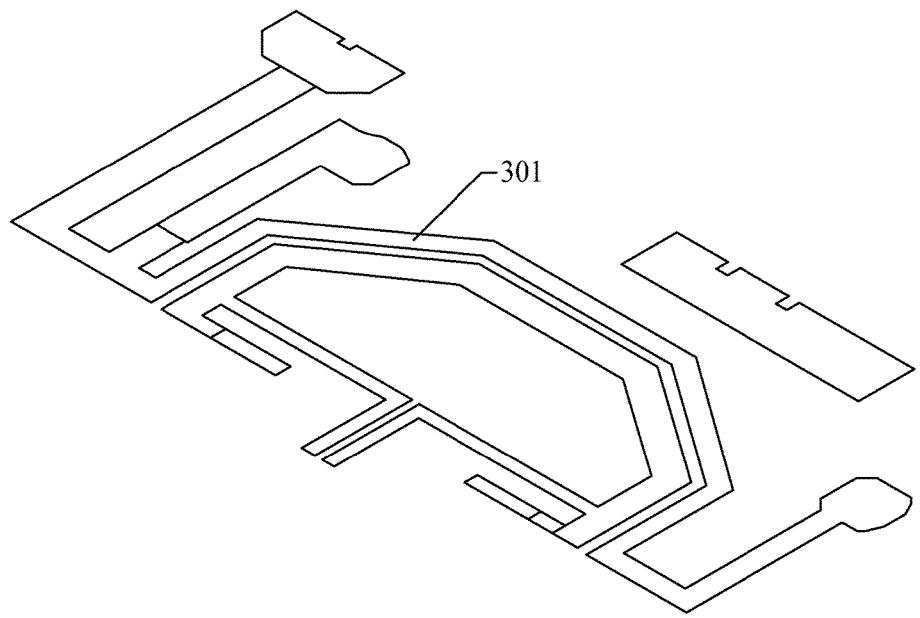
FIG. 3A is a structural diagram of an upper metal sheet in an output balun, according to an embodiment of the differential amplifier of the present application.
Figure 3B:
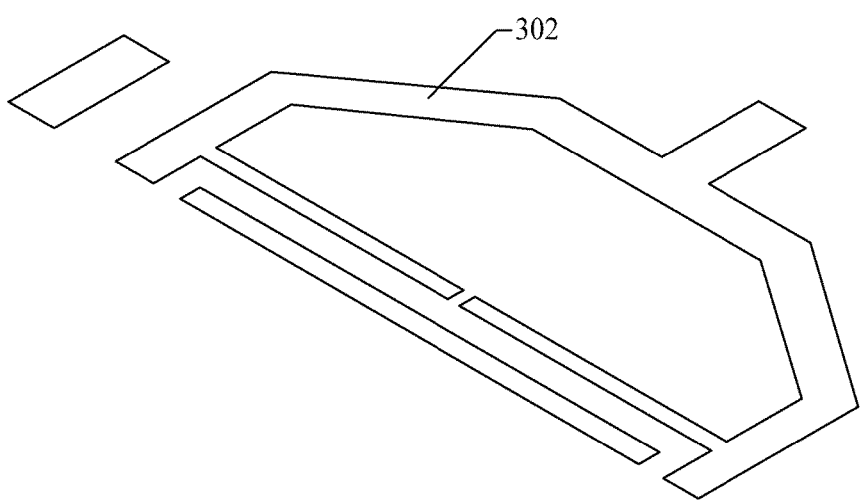
FIG. 3B is a structural diagram of a lower metal sheet in an output balun, according to an embodiment of the differential amplifier of the present application.

FIG. 3A is a structural diagram of an upper metal sheet 301 in an output balun, according to an embodiment of the differential amplifier of the present application; FIG. 3B is a structural diagram of a lower metal sheet 301 in an output balun, according to an embodiment of the differential amplifier of the present application; and FIG. 3C is a structural diagram of the whole output balun 105, according to an embodiment of the differential amplifier of the present application.

Figure 3C:
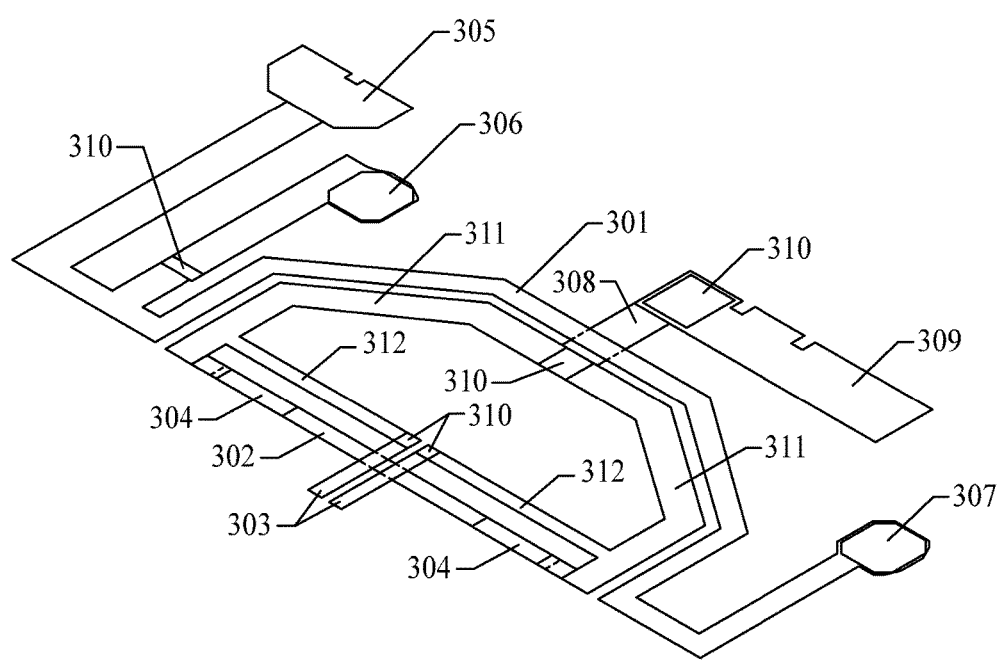
FIG. 3C is a structural diagram of the whole output balun, including the upper and lower metal sheets of FIGS. 3A and 3B, and according to an embodiment of the differential amplifier of the present application.

Referring to FIG. 3A through FIG. 3C, the output balun 105 comprises an upper metal sheet 301 and a lower metal sheet 302. The upper metal sheet 301 is of a structure having an inner full frame and an outer half frame. A fracture is formed in the inner full frame of the upper metal sheet 301, and two differential input terminals 303 are extended from the fracture in the inner full frame of the upper metal sheet. The two differential input terminals 303 are connected to two output terminals of the differential transistor pair 103. Two capacitor terminals 304 are extended from two sides of the inner full frame of the upper metal sheet 301, and two capacitor structures are formed between the two capacitor terminals 304 and the lower metal sheet 302. Three terminals, that are an output terminal 305, a capacitor ground terminal 306 and an output balun ground terminal 307, are extended outward from the half frame of the upper metal sheet 301. The output terminal 305 is used for outputting a signal. A capacitor structure is formed between the capacitor ground terminal 306 and the lower metal sheet 302, and the capacitor ground terminal 306 is grounded through the upper metal sheet 301. The output balun ground terminal 307 is grounded. The lower metal sheet 302 is of a structure having an inner full frame. The lower metal sheet 302 further comprises an output balun center tap 308 which is connected to a DC bias terminal 309 through the upper metal sheet 301. Since a joint between the output balun center tap 308 and the inner full frame of the lower metal sheet 302 is virtual for a radio frequency signal and is always kept at a zero potential for an AC signal, only a segment of a microstrip is needed to be extended from the joint between the output balun center tap 308 and the inner full frame of the lower metal sheet 302. That is, an output balun center tap 308 is additionally provided, and the DC signal is directed at the output balun center tap 308. That is, the output balun center tap 308 is connected to the DC bias terminal 309 through the upper metal sheet 301, causing a small impact on the AC signal and thus simplifying the design of the bias network 104. The inner full frame structure of the lower metal sheet 302 and the inner full frame structure of the upper metal sheet 301 are overlapped together. The upper metal sheet 301 is connected to the lower metal sheet 302 via through holes. The output balun includes five output balun through holes 310, which are respectively located at two joints between the two differential input terminals 303 and the inner full frame of the upper metal sheet 301, at a joint between the output balun center tap 308 and the inner full frame of the lower metal sheet 302, at a joint between the output balun center tap 308 and the DC bias terminal 309, and at a joint between the capacitor ground terminal 306 and the lower metal sheet 302. By designing the output balun through holes 310, the upper metal sheet 301 can be communicated with the lower metal sheet 302 through the output balun through holes 310. In this way, the upper metal sheet 301 and the lower metal sheet 302 share a same ground. Thus, the occupation area of the input balun 101 is effectively reduced.

The output balun through holes 310 are each formed in such a way that a hole is punched between the upper metal sheet 301 and the lower metal sheet 302, and then metal is injected into the hole so that the upper metal sheet 301 and the lower metal sheet 302 are connected. The output balun through holes 310 provide communication between the two metal sheets, increases the number of conductive layers, and thus reduces the DC loss.

Optionally, a direct current is supplied to the output balun center tap 308, and shunted at a joint between the output balun center tap 308 and the inner full frame of the lower metal sheet 302 so that the direct current flows along the inner full frame of the upper metal sheet 301 and the inner full frame of the lower metal sheet 302 and respectively flows out from the two differential input terminals 303.

Optionally, the inner full frame of the output balun 105 includes an output balun coupling portion 311 and an output balun non-coupling portion 312. The output balun non-coupling portion 312 is a portion close to the two differential input terminals 303. Since metal loss is mainly resulted from the skin effect of the alternating current (AC) and a DC resistance, and a wide and thick metal layer is greatly influenced by the skin effect, it only needs to ensure that the microstrip can withstand a current under a desired high voltage and high power to decrease the influence of the skin effect. In view of this, the output balun non-coupling portion 312 employs a narrow microstrip structure, that is, the width of the metal layer of the output balun non-coupling portion 312 is 0.15 µm. By the design of the narrow microstrip, the metal loss resulted from the skin effect is effectively reduced. Meanwhile, the two joints between the two differential input terminals 303 of the output balun 105 and the inner full frame of the upper metal sheet 301 are appropriately brought to be closer, and by the design of the narrow microstrip, the distance between the differential input terminals 303 is reduced. In this way, the inductive reactance of the output balun 105 is effectively increased, the capacitive reactance of the output balun 105 is reduced, and the self-resonant frequency is increased, so that the operating frequency is improved and the occupation area of the output balun 105 is reduced. The output balun coupling portion 311 is a portion away from the two differential input terminals 303, and is of a wide microstrip structure. The design of the wide microstrip structure is to increase the coupling coefficient, and to couple the differential signals from the inner full frame to the outer half frame through laterally magnetic coupling to realize single-ended output.

Both the upper metal sheet 301 and the lower metal sheet 302 are used as coils, so that the inner full frame of the output balun 105 and the capacitors connected thereto form resonance at a desired frequency. In this way, the leakage of energy is reduced and the desired impedance matching is realized.

Optionally, both the input balun 101 and the output balun 105 are made of GaN or GaAs. Differential amplifiers break through the power output limitation due to their advantages in suppressing common-mode signals, reducing even harmonic components, and suppressing odd-mode oscillation. In the present application, the effective combination of GaN or GaAs and differential amplifiers is realized. By constructing a GaN-based or GaAs-based differential amplifier to effectively combine the advantages of GaN or GaAs and the advantages of differential amplifiers together, even harmonic components are suppressed, the output power is increased, and high power amplification efficiency is realized. Moreover, in the present application, no any other harmonic control structure is required, so that even harmonic components, especially second harmonic components, are naturally suppressed, because other higher-order harmonic components in the output signal are relatively small.

Figure 4:
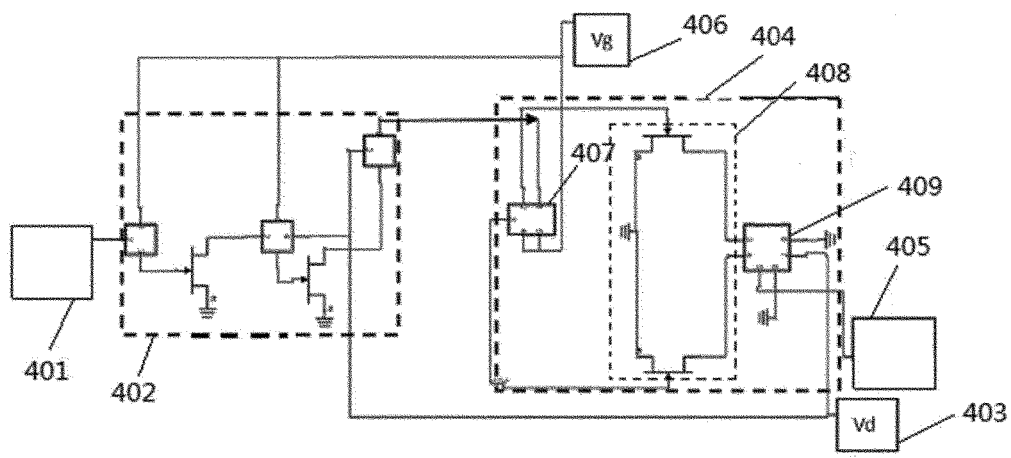
FIG. 4 is a schematic circuit diagram of a GaN-based differential amplifier, according to the present application.

FIG. 4 is a schematic circuit diagram of a GaN-based differential amplifier, according to the present application.

Referring to FIG. 4, the GaN-based differential amplifier circuit consists of a signal input terminal 401, a pre-driver module 402, a drain bias terminal 403, a differential amplifier module 404, a signal output terminal 405 and a gate bias terminal 406. The differential amplifier module 404 includes an input balun module 407, a transistor module 408 and an output balun module 409.

Actually, FIG. 4 may be considered as an effect of the conversion from the layout view of FIG. 1 to the circuit diagram. The input balun module 407 corresponds to the input balun 101, the matching network 102 and the bias network 104 in FIG. 1 of the present application. The transistor module 408 corresponds to the differential transistor pair 103 in FIG. 1 of the present application. The output balun module 409 corresponds to the output balun 105 in FIG. 1 of the present application.

So, the pre-driver module 402 is connected to the signal input terminal 401 to receive an input signal. An input terminal of the input balun module 407 is connected to an output terminal of the pre-driver module 402. The input balun module 407 further includes two differential output interfaces and two gate voltage interfaces. The transistor module 408 includes two transistors, and the sources of the two transistors are connected and grounded. The two differential output interfaces are correspondingly connected to the gates of the two transistors of the transistor module 408, respectively. The two gate voltage interfaces are both connected to the gate bias terminal 406. The output balun module 409 includes two transistor drain interfaces, two ground interfaces, two capacitor interfaces, one drain bias interface and one output interface. Wherein, the two transistor drain interfaces are correspondingly connected to the drains of the two transistors of the transistor module 408, respectively. The two ground interfaces are grounded. The two capacitor interfaces are connected to capacitors. The one drain bias interface is connected to the drain bias terminal 403. The one output interface is connected to the signal output terminal 405.

Figure 5A:
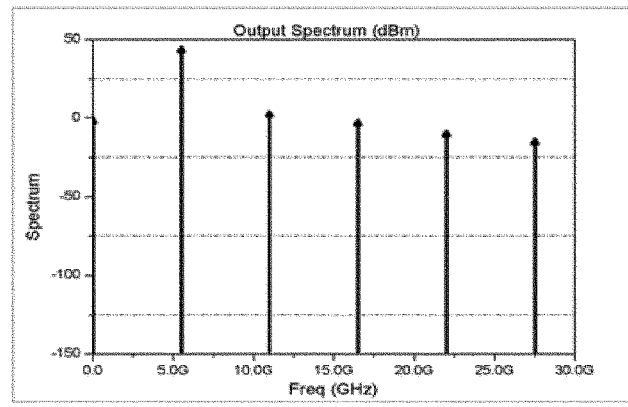
FIG. 5A is a view showing harmonic components in a simulation result of the schematic circuit diagram of the GaN-based differential amplifier of FIG. 4, according to the present application.
Figure 5B:
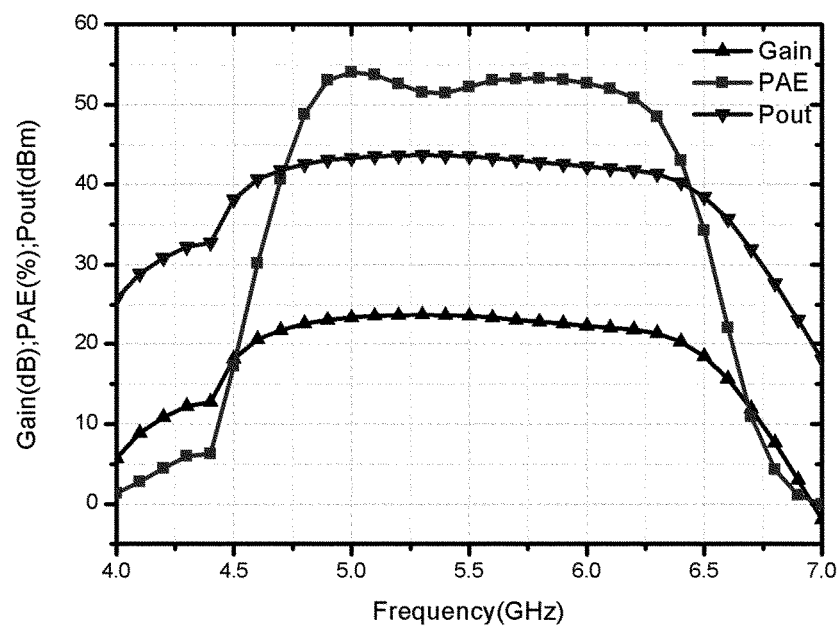
FIG. 5B is a view showing the simulation result of, in terms of the output power (Pout), the efficiency (PAE) and the gain (Gain), the schematic circuit diagram of the GaN-based differential amplifier of FIG. 4, according to the present application.

FIG. 5A is a view showing harmonic components in a simulation result of the schematic circuit diagram of the GaN-based differential amplifier of FIG. 4, according to the present application; and FIG. 5B is a view showing the simulation result of, in terms of the output power (Pout), the efficiency (PAE) and the gain (Gain), the schematic circuit diagram of the GaN-based differential amplifier of FIG. 4, according to the present application.

Referring to FIG. 5A and FIG. 5B, the GaN-based differential amplifier of the present application can effectively suppress the even harmonic components, and can increase the output power, improve the amplification efficiency, and increase the gain.

Optionally, the bias network consists of a choke inductor and a decoupling capacitor so that the purpose of allowing direct current to pass and preventing alternative current from passing is realized.

Specific examples are used herein to illustrate the principle and embodiments of the present invention, and the above description of the embodiments is only used to help understanding the methodology and concept of the present invention. Meanwhile, for those skilled in the art, changes may be made to the specific embodiments and application ranges according to the concept of the present invention. In conclusion, the content of the description should not be constructed as a limit to the present invention.

What is claimed is:

1. A differential amplifier, comprising:
an input balun,
a matching network,
a differential transistor pair,
a bias network, and
an output balun;
wherein, an input terminal of the input balun is connected to an output terminal of a pre-driver stage, the output terminal of the pre-driver stage is connected to the input terminal of the input balun, an output terminal of the input balun is connected to an input terminal of the matching network, an output terminal of the matching network is connected to an input terminal of the differential transistor pair and is also connected to the bias network, an output terminal of the differential transistor pair is connected to the output balun; and wherein the input balun is a single-turn laminated transformer, and the output balun is a planar transformer having an inner full frame and an outer half frame.

2. The differential amplifier according to claim 1, wherein the input balun consists of an upper metal ring and a lower metal ring, which are overlapped;

wherein, the upper metal ring and the lower metal ring each consist of horizontal single-layer metal sheets; a fracture is formed in each of the upper metal ring and the lower metal ring; a single-ended input terminal and an input balun ground terminal are extended from the fracture in the upper metal ring, the single-ended input terminal being connected to the output terminal of the pre-driver stage, the input balun ground terminal being grounded; two differential output terminals are extended from the fracture in the lower metal ring, the two differential output terminals being connected correspondingly to two matching networks;

the lower metal ring further comprises an input balun center tap which is grounded; and the input balun ground terminal of the upper metal ring is connected to the input balun center tap of the lower metal ring through an input balun through hole.

3. The differential amplifier according to claim 1, wherein the output balun consists of an upper metal sheet and a lower metal sheet;

wherein, the upper metal sheet is of a structure having an inner full frame and an outer half frame; a fracture is formed in the inner full frame of the upper metal sheet, and two differential input terminals are extended from the fracture in the inner full frame of the upper metal sheet, the two differential input terminals being connected to two output terminals of the differential transistor pair; two capacitor terminals are extended from two sides of the inner full frame of the upper metal sheet, two capacitor structures being formed between the two capacitor terminals and the lower metal sheet; three terminals, that are an output terminal, a capacitor ground terminal and an output balun ground terminal, are extended outward from the outer half frame of the upper metal sheet; the output terminal is used for outputting a signal; a capacitor structure is formed between the capacitor ground terminal and the lower metal sheet, and the capacitor ground terminal is grounded through the upper metal sheet; the output balun ground terminal is grounded;

the lower metal sheet is of a structure having an inner full frame and further comprises an output balun center tap which is connected to a DC bias terminal through the upper metal sheet;

the inner full frame of the lower metal sheet and the inner full frame of the upper metal sheet are overlapped together; and the upper metal sheet is connected to the lower metal sheet via through holes, and the output balun comprises five output balun through holes which are respectively located at two joints between the two differential input terminals and the inner full frame of the upper metal sheet, at a joint between the output balun center tap and the inner full frame of the lower metal sheet, at a joint between the output balun center tap and the DC bias terminal, and at a joint between the capacitor ground terminal and the lower metal sheet.

4. The differential amplifier according to claim 3, wherein a direct current is supplied to the output balun center tap, and shunted at a joint between the output balun center tap and the inner full frame of the lower metal sheet so that the direct current flows along the inner full frame of the upper metal sheet and the inner full frame of the lower metal sheet and then respectively flows out from the two differential input terminals.

5. The differential amplifier according to claim 3, wherein the inner full frame of the output balun comprises an output balun coupling portion and an output balun non-coupling portion;

wherein, the output balun non-coupling portion is a portion close to the two differential input terminals, and is of a narrow microstrip structure; and the output balun coupling portion is a portion away from the two differential input terminals, and is of a wide microstrip structure.

6. The differential amplifier according to claim 2, wherein an overlapped portion of the upper metal ring and the lower metal ring in the input balun is structurally designed as a rectangle; and the input balun is vertically coupled through four sides of the rectangle.

7. The differential amplifier according to claim 1, wherein both the input balun and the output balun are made of GaN.

* * * * *